(12) United States Patent
Hong

(10) Patent No.: US 6,361,661 B2
(45) Date of Patent: *Mar. 26, 2002

(54) HYBRID COIL DESIGN FOR IONIZED DEPOSITION

(75) Inventor: Liubo Hong, San Jose, CA (US)

(73) Assignee: Applies Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/857,944

(22) Filed: May 16, 1997

(51) Int. Cl.[7] ................................. C23C 14/34

(52) U.S. Cl. ...................... 204/192.12; 204/298.06; 204/298.09

(58) Field of Search ................ 204/192.12, 298.06, 204/298.09; 118/723 I

(56) References Cited

U.S. PATENT DOCUMENTS

| | | | |
|---|---|---|---|
| 3,730,867 A | 5/1973 | Albers et al. |
| 4,123,316 A | 10/1978 | Tsuchimoto |
| 4,336,118 A | 6/1982 | Patten et al. |
| 4,361,472 A | 11/1982 | Morrison, Jr. |
| 4,362,632 A | 12/1982 | Jacob |
| 4,422,896 A | 12/1983 | Class et al. |
| 4,626,312 A | 12/1986 | Tracy |
| 4,661,228 A | 4/1987 | Mintz |
| 4,716,491 A | 12/1987 | Ohno et al. |
| 4,792,732 A | 12/1988 | O'Loughlin |
| 4,842,703 A | 6/1989 | Class et al. |
| 4,844,775 A | 7/1989 | Keeble |
| 4,865,712 A | 9/1989 | Mintz |
| 4,871,421 A | 10/1989 | Ogle et al. |
| 4,918,031 A | 4/1990 | Flamm et al. |
| 4,925,542 A | 5/1990 | Kidd |

(List continued on next page.)

FOREIGN PATENT DOCUMENTS

| | | |
|---|---|---|
| EP | 0520519 | 12/1992 |
| EP | 0601595 | 12/1993 |
| EP | 0607797 | 1/1994 |
| EP | 0653776 | 10/1994 |
| EP | 0727807 | 1/1996 |
| EP | 0727923 | 2/1996 |
| EP | 0758148 | 8/1996 |
| GB | 2162365 | 1/1986 |
| GB | 2231197 | 11/1990 |
| JP | 59190363 | 10/1984 |
| JP | 61190070 | 8/1986 |
| JP | 63246814 | 4/1987 |
| JP | 6232055 | 8/1994 |
| JP | 6283470 | 10/1994 |
| JP | 7176398 | 7/1995 |
| JP | 7176399 | 7/1995 |
| JP | 888190 | 4/1996 |
| JP | 8153712 | 6/1996 |
| JP | 8288259 | 11/1996 |
| WO | 8606923 | 11/1986 |
| WO | 9515372 | 6/1995 |

OTHER PUBLICATIONS

U.S. Serial No. 08/857,720 (Atty. Dkt. No. 1800).
U. S. Serial No. 08/857,921 (Atty. Dkt. No. 1737).
U.S. Serial No. 08/908,341 (Atty. Dkt. 1873).

(List continued on next page.)

Primary Examiner—Stephen Kalafut
Assistant Examiner—Julian A. Mercado
(74) Attorney, Agent, or Firm—Konrad Raynes Victor & Mann LLP

(57) ABSTRACT

A sputtering hybrid coil for a plasma chamber in a semiconductor fabrication has an enhanced sputtering surface and an internal coolant carrying channel thermally coupled to the sputtering surface to cool the sputtering surface and the coil.

49 Claims, 3 Drawing Sheets

U.S. PATENT DOCUMENTS

| | | | |
|---|---|---|---|
| 4,941,915 A | | 7/1990 | Matsuoka et al. |
| 4,948,458 A | | 8/1990 | Ogle |
| 4,990,229 A | | 2/1991 | Campbell et al. |
| 4,999,096 A | | 3/1991 | Nihei et al. |
| 5,065,698 A | | 11/1991 | Koike |
| 5,091,049 A | | 2/1992 | Campbell et al. |
| 5,102,496 A | | 4/1992 | Savas |
| 5,122,251 A | | 6/1992 | Campbell et al. |
| 5,135,629 A | | 8/1992 | Sawada et al. |
| 5,135,634 A | | 8/1992 | Clarke |
| 5,146,137 A | | 9/1992 | Gesche et al. |
| 5,175,608 A | | 12/1992 | Nihei et al. |
| 5,178,739 A | | 1/1993 | Barnes et al. |
| 5,198,725 A | | 3/1993 | Chen et al. |
| 5,206,516 A | | 4/1993 | Keller et al. |
| 5,225,740 A | | 7/1993 | Ohkawa |
| 5,231,334 A | | 7/1993 | Paranjpe |
| 5,234,560 A | | 8/1993 | Kadlec et al. |
| 5,241,245 A | | 8/1993 | Barnes et al. |
| 5,280,154 A | * | 1/1994 | Cuomo et al. ......... 219/121.52 |
| 5,304,279 A | | 4/1994 | Coultas et al. |
| 5,312,717 A | | 5/1994 | Sachdev et al. |
| 5,346,578 A | | 9/1994 | Benzing et al. |
| 5,361,016 A | | 11/1994 | Ohkawa et al. |
| 5,366,590 A | | 11/1994 | Kadomura |
| 5,368,685 A | | 11/1994 | Kumihashi et al. |
| 5,397,962 A | | 3/1995 | Moslehi |
| 5,401,350 A | | 3/1995 | Patrick et al. |
| 5,404,079 A | | 4/1995 | Ohkuni et al. |
| 5,417,834 A | * | 5/1995 | Latz ...................... 204/298.11 |
| 5,418,431 A | | 5/1995 | Williamson et al. |
| 5,421,891 A | | 6/1995 | Campbell et al. |
| 5,429,070 A | | 7/1995 | Campbell et al. |
| 5,429,710 A | | 7/1995 | Akiba et al. |
| 5,429,995 A | | 7/1995 | Nishiyama et al. |
| 5,430,355 A | | 7/1995 | Paranjpe |
| 5,433,812 A | | 7/1995 | Cuomo et al. |
| 5,434,353 A | | 7/1995 | Kraus |
| 5,464,476 A | | 11/1995 | Gibb et al. |
| 5,503,676 A | | 4/1996 | Shufflebotham et al. |
| 5,525,159 A | | 6/1996 | Hama et al. |
| 5,556,501 A | | 9/1996 | Collins et al. |
| 5,573,595 A | | 11/1996 | Dible |
| 5,587,038 A | | 12/1996 | Cecchi et al. |
| 5,589,224 A | * | 12/1996 | Tepman et al. .......... 427/248.1 |
| 5,639,357 A | | 6/1997 | Xu |
| 5,650,032 A | * | 7/1997 | Keller et al. ................ 156/345 |
| 5,669,975 A | | 9/1997 | Ashtiani |
| 5,683,537 A | * | 11/1997 | Ishii ........................... 156/345 |
| 5,690,781 A | | 11/1997 | Yoshida et al. |
| 5,707,498 A | * | 1/1998 | Ngan ..................... 204/192.12 |
| 5,721,021 A | | 2/1998 | Tobe et al. |
| 5,763,851 A | * | 6/1998 | Forster et al. ......... 219/121.43 |
| 5,770,098 A | | 6/1998 | Araki et al. |
| 5,783,492 A | | 7/1998 | Higuchi et al. |
| 5,795,429 A | | 8/1998 | Ishii et al. |
| 5,803,977 A | * | 9/1998 | Tepman et al. ............. 118/728 |
| 5,810,931 A | | 9/1998 | Stevens et al. |
| 5,851,600 A | | 12/1998 | Horiike et al. |
| 5,874,704 A | | 2/1999 | Gates |
| 5,951,775 A | * | 9/1999 | Tepman ...................... 118/729 |
| 5,961,793 A | * | 10/1999 | Ngan ..................... 204/192.12 |
| 6,023,038 A | * | 2/2000 | Van Gogh .................. 219/121 |
| 6,077,402 A | * | 6/2000 | Hong et al. ............ 204/192.12 |
| 6,146,508 A | * | 11/2000 | Gopairaja et al. ..... 204/298.06 |
| 6,210,539 B1 | * | 4/2001 | Tanaka et al. ......... 204/192.12 |
| 6,217,778 B1 | * | 4/2001 | Hofmann et al. ...... 204/192.12 |
| 6,228,229 B1 | * | 5/2001 | Raaijmakers et al. .. 204/192.12 |
| 6,235,169 B1 | * | 5/2001 | Gopalraja et al. ..... 204/298.06 |
| 6,254,746 B1 | * | 7/2001 | Subramani et al. .... 204/298.11 |
| 6,264,812 B1 | * | 7/2001 | Raaijmakers et al. .. 204/298.06 |
| 6,297,595 B1 | * | 10/2001 | Stimson et al. ......... 315/111.51 |

OTHER PUBLICATIONS

U.S. Serial No. 08/971,867 (Atty. Dkt. 1957.P1).

U.S. Serial No. 09/039,695 (Atty. Dkt. 1727).

M. Yamashita, "Sputter Type High Frequency Ion Source for Ion Beam Deposition Apparatus," *Jap. J. Appl. Phys.,* vol. 26, pp. 721–727, 1987.

M. Yamashita, "Fundamental Characteristics of Built–in High Frequency Coil Type Sputtering Apparatus," *J. Vac. Sci. Technol.,* vol. A7, pp. 151–158, 1989.

S.M. Rossnagel et al., "Metal Ion Deposition from Ionized Magnetron Sputtering Discharge," *J. Vac. Sci. Technol.,* vol. B12, pp. 449–453, 1994.

S.M. Rossnagel et al., "Magnetron Sputter Deposition with High Levels of Metal Ionization," *Appl. Phys. Lett.,* vol. 63, pp. 3285–3287, 1993.

S.M. Rossnagel, et al., "Filling Dual Damascene Interconnect Structures with AlCu and Cu Using Ionized Magnetron Deposition," *J. Vac. Sci. Technol.,* vol. B13, pp. 125–129, 1995.

Y–W. Kim et al., "Directed Sputter Deposition of AlCu: Film Microstructure and Chemistry," *J. Vac. Sci. Technol.,* vol. A12, pp. 3169–3175, 1994.

J. Hopwood et al., "Mechanisms for Highly Ionized Magnetron Sputtering," *J. Appl. Phys.,* vol. 78, pp. 758–765, 1995.

P. Kidd, "A Magnetically Confined and ECR Heated Plasma Machine for Coating and Ion Surface Modification Use," *J. Vac. Sci. Technol.,* vol. A9, pp. 466–473, 1991.

W.M. Holber, et al., "Copper Deposition by Electron Cyclotron Resonance Plasma," *J. Vac. Sci. Technol.,* vol. A11, pp. 2903–2910, 1993.

S.M. Rossnagel, "Directional and Ionized Sputter Deposition for Microelectronics Applications," *Proc. of 3rd ISSP (Tokyo),* pp. 253–260, 1995.

M. Matsuoka et al., Dense Plasma Production and Film Deposition by New High–Rate Sputtering Using an Electric Mirror, *J. Vac. Sci. Technol.,* A 7 (4), 2652–2657, Jul./Aug. 1989.

N. Jiwari et al., "Helicon wave plasma reactor employing single–loop antenna," *J. of Vac. Sci. Technol.,* A 12(4), pp. 1322–1327, Jul./Aug. 1994.

Search report dated Feb. 27, 1997, EPC application No. 96308251.6.

U.S. patent application serial No. 081733,620, filed Oct. 17, 1996 (Attorney Docket #No. 1457/PVD/DV).

Hayden, D.B., et al., "Characterization of magnetron–sputtered partially ionized aluminum deposition," J. Vac. Sci. Technol. A 16(2), 624–627.

Schneider, Jochen M., et al., "Crystalline alumina deposited at low temperatures by ionized magnetron sputtering," J. Vac. Sci. Technol. A15(3), pp. 1084–1088.

U.S. patent application No. 08/851,946 (Atty. Dkt. 1390.C1).

* cited by examiner

HYBRID COIL DESIGN FOR IONIZED DEPOSITION

FIELD OF THE INVENTION

The present invention relates to ionized deposition processes, and more particularly, to a method and apparatus for sputtering a coil in the fabrication of semiconductor devices.

BACKGROUND OF THE INVENTION

To improve bottom coverage of high aspect ratio vias, channels and other openings in a wafer or other substrate, the deposition material may be ionized in a plasma prior to being deposited onto the substrate. The ionized deposition material may be redirected by electric fields to ensure more material reaches the bottom areas. It has been found that it is desirable to increase the density of the plasma to increase the ionization rate of the sputtered material in order to decrease the formation of unwanted cavities in the deposition layer. As used herein, the term "dense plasma" is intended to refer to one that has a high electron and ion density.

There are several known techniques for exciting a plasma with RF fields including capacitive coupling, inductive coupling and wave heating. In a standard inductively coupled plasma (ICP) generator, RF current passing through an antenna in the form of a coil surrounding the plasma induces electromagnetic currents in the plasma. These currents heat the conducting plasma by ohmic heating, so that it is sustained in steady state. As shown in U.S. Pat. No. 4,362,632, for example, current through a coil is supplied by an RF generator coupled to the coil through an impedance matching network, such that the coil acts as the first windings of a transformer. The plasma acts as a single turn second winding of a transformer.

A high density plasma typically requires the chamber to be operated at a relatively high pressure. As a result, the frequency of collisions between the plasma ions and the deposition material atoms is increased and the scattering of the deposition atoms is likewise increased. This scattering of the deposition atoms typically causes the thickness of the deposition layer on the substrate to be thicker on that portion of the substrate aligned with the center of the target and thinner in the outlying regions. Such nonuniformity of deposition is often undesirable in the fabrication of semiconductor devices. Thus, although ionizing the deposition material in a high density plasma can facilitate deposition of material into high aspect ratio channels and vias, many sputtered contact metals have a tendency to deposit more thickly in the center of the wafer as compared to the edges.

The deposition layer can be made more uniform by reducing the distance between the target and the substrate, which reduces the effect of plasma scattering. However, decreasing the distance between the target and the substrate decreases the ionization of the deposition material and, hence, increases the formation of unwanted cavities in the deposition layer. For this reason, it is important to maintain a relatively high plasma ionization rate to minimize cavity formation in the deposition layer.

As described in copending application Ser. No. 08/680,335, entitled "Coils for Generating a Plasma and for Sputtering," filed Jul. 10, 1996 and assigned to the assignee of the present application, which application is incorporated herein by reference in its entirety, it has been recognized that the coil itself may provide a source of sputtered material to supplement the deposition material sputtered from the primary target of the chamber. Application of an RF signal to the coil can cause the coil to develop a negative bias which will attract positive ions which can impact the coil causing material to be sputtered from the coil. Because the material sputtered from the coil tends to deposit more thickly at the periphery of the wafer, the center thick tendency for material sputtered from the primary target can be compensated by the edge thick tendency for material sputtered from the coil. By shaping the coil in the form of a ribbon, it has been found that uniformity can be improved.

However, because relatively large currents are passed through the coil to energize the plasma, the coil often undergoes significant resistive heating. In addition, ions impacting the coil can further heat the coil if the coil is used as a sputtering source. As a result, the coil can reach relatively high temperatures which can have an adverse effect on the wafer, the wafer deposition process or even the coil itself. Moreover, the coil will cool once the deposition is completed and the current to the coil is removed. Each heating and subsequent cooling of the coil causes the coil to expand and then contract. This thermal cycling of the coil can cause target material deposited onto the coil to generate particulate matter which can fall onto and contaminate the wafer.

To reduce coil heating, it has been proposed in some applications to form the coil from hollow tubing through which a coolant such as water is passed. However, such tubing typically has a relatively poor sputtering rate and therefore is not well suited to sputtering. As a consequence, improvements in uniformity may be more difficult to achieve, particularly if a relatively high rate of coil sputtering is needed.

SUMMARY OF THE PREFERRED EMBODIMENTS

It is an object of the present invention to provide an improved method and apparatus for sputtering which obviates, for practical purposes, the above-mentioned limitations, particularly in a manner requiring a relatively uncomplicated arrangement.

These and other objects and advantages are achieved by, in accordance with one aspect of the invention, an RF coil disposed within a vacuum chamber, between a target and substrate support, wherein the coil has both a coolant carrying channel and a sputtering surface shaped to enhance sputtering of the coil. The coil sputtering surface provides for sputtering at sufficiently high rates to reduce non-uniformity in the deposition layer on the substrate. At the same time, a coolant carrying channel defined within the coil facilitates heat transfer from the sputtering surface to the coolant to prevent the coil from reaching undesirably high temperatures during the sputtering process and prevent thermal cycling.

In one embodiment, the coil comprises two coils joined together to form a hybrid coil. A first RF coil, which sputters deposition material onto a substrate, is disposed within the vacuum chamber and extends through a space defined between the target and substrate. This first coil may be a ribbon-shaped coil which is especially suited for providing edge-thick sputter depositing of material at a rate sufficient to offset the center-thick deposition from the target, thereby enhancing the uniformity of the deposition layer. A second tubular-shaped coil is thermally and electrically coupled to the first coil to absorb heat from the first coil. Such an arrangement facilitates economical manufacture of the hybrid coil as discussed below.

DETAILED DESCRIPTION OF THE DRAWINGS

Figure 1:
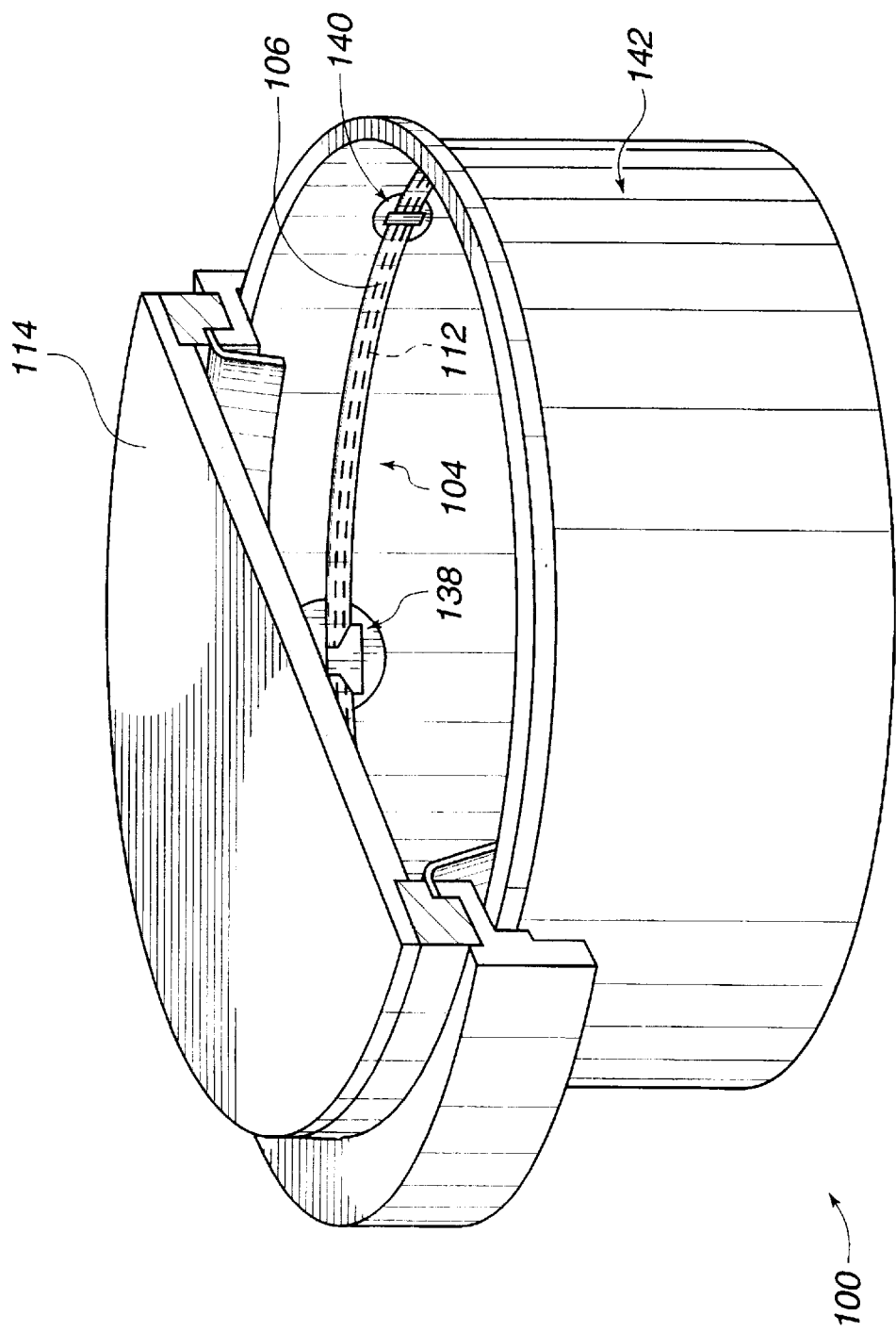
FIG. 1 is a perspective, partial cross-sectional view of a plasma generating chamber having a hybrid coil in accordance with one embodiment of the present invention.
Figure 2:
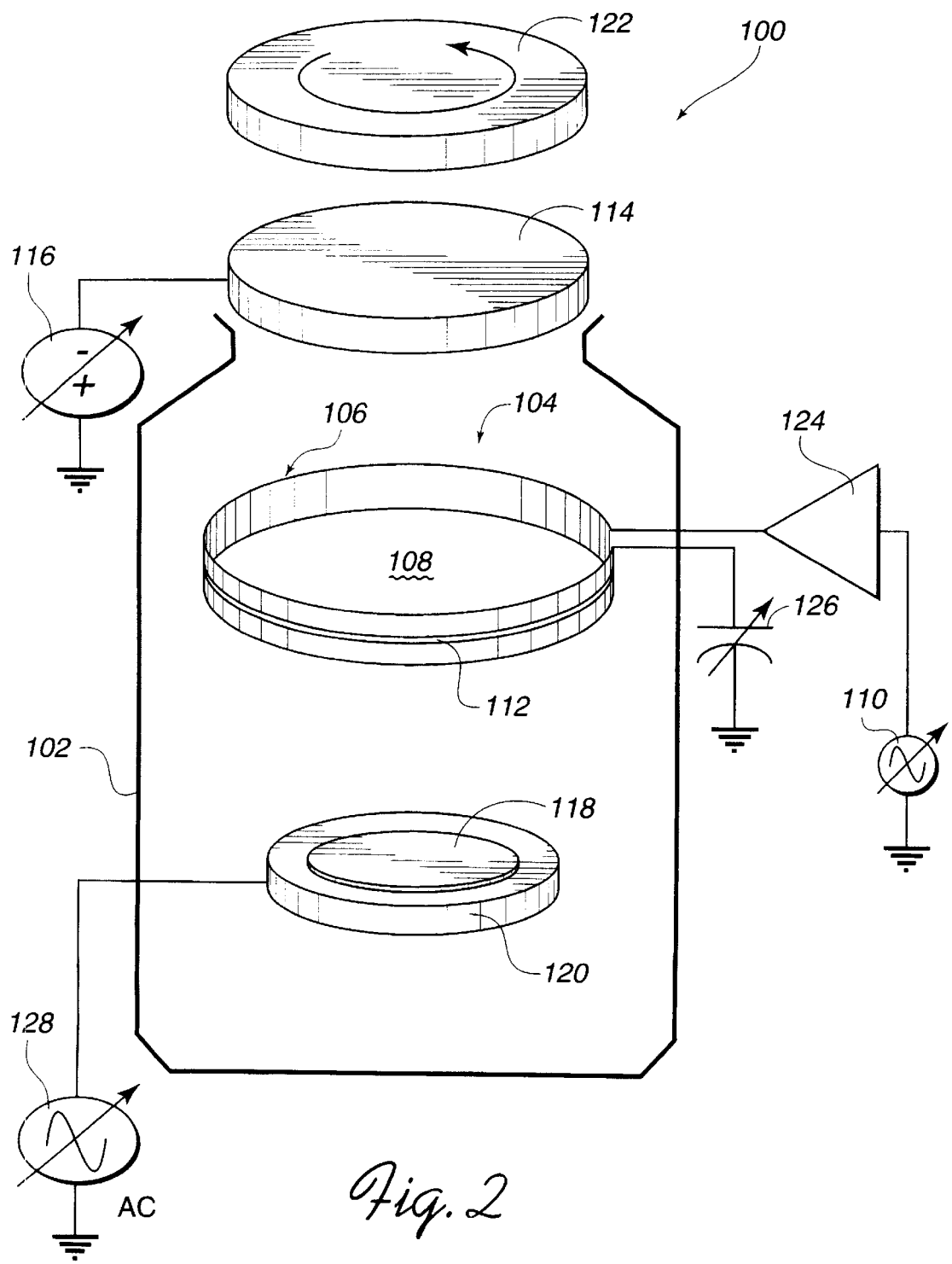
FIG. 2 is a schematic diagram of the electrical interconnections to the plasma generating chamber of FIG. 1.

Referring to FIGS. 1 and 2, a plasma generator in accordance with a first embodiment of the present invention comprises a substantially cylindrical plasma chamber 100 which is received in a vacuum chamber 102 (shown schematically in FIG. 2). The plasma chamber 100 of this embodiment has a one-turn or multiple-turn hybrid antenna or coil 104 which includes a first RF ribbon coil 106 encircling an interior plasma generation area 108. Radio frequency (RF) energy from an RF generator 110 is radiated from the first RF coil 106 of the hybrid coil 104 into the interior area 108 of the deposition system 100, which energizes a plasma within the deposition system 100. A second, tubular coil 112 of the hybrid coil 104 is thermally and electrically coupled to the outer surface of the first coil 106 to cool the first coil 106 by absorbing heat therefrom. This second coil 112 may also radiate RF energy.

An ion flux strikes a negatively biased target 114 positioned at the top of the chamber 102. The target 114 is preferably negatively biased by a DC power source 116. The first coil 106 also develops a negative bias to attract ions. The plasma ions eject material from the target 114 and first coil 106 onto a substrate 118 which may be a wafer or other workpiece which is supported by a pedestal 120 at the bottom of the deposition system 100. A rotating magnet assembly 122 provided above the target 114 produces magnetic fields-which sweep over the face of the target 114 to promote uniform erosion of the target.

The atoms of material ejected from the target 114 and first coil 106 are in turn ionized by the plasma being energized by the first coil 106 which is inductively coupled to the plasma. The RF generator 110 is preferably coupled to the first coil 106 through an amplifier and impedance matching network 124. The other end of the first RF coil 106 is coupled to ground, preferably through a capacitor 126 which may be a variable capacitor. The ionized deposition material is attracted to the substrate 118 and forms a deposition layer thereon. The pedestal 120 may be negatively biased by an AC (or DC or RF) source 128 so as to externally bias the substrate 118. Also, the substrate 118 may self bias in some applications such that external biasing of the substrate 118 may optionally be eliminated.

As will be explained in greater detail below, in accordance with one aspect of the present invention, material is sputtered from the ribbon-shaped first RF coil 106 of the water-cooled hybrid coil 104, onto the substrate 118, while the first coil 106 is cooled by the second, tubular-shaped coil 112 of the hybrid coil 104. As best seen in FIG. 3A which is a cross-sectional view in the radial plane orthogonal to the longitudinal tangential axis 130 (FIG. 3), the first RF coil 106 preferably has a relatively flat face 132 facing the interior of the chamber for sputtering material to offset substantially the center-thick deposition from the target 114 and, hence, improve the uniformity of the deposition.

To cool the first coil 106, the second coil 112 coupled to the first coil 106 is preferably a tubular coil to facilitate absorbing heat from the first coil. The use of the term "tubular" hereinafter refers to any tubed shaped object, wherein the radial cross-section of the outer surface may be comprised of any suitable shape, including circular (as shown in FIG. 3A) or any non-circular shape such as rectangular. The second tubular coil 112 defines an internal channel 134 which permits the flow of a coolant such as water through the coil 112. The water is preferably circulated through the coil 112 in a closed system having a heat exchanger (not shown) to facilitate heat transfer from the coil. In preferred embodiments, the first coil 106 and second tubular coil 112 of the hybrid coil 104 are fastened together so that the coils are thermally and electrically coupled together. The electrical coupling of the first and second coils permits both coils to radiate RF energy from a single source. Thermal coupling facilitates heat transfer from the RF coil 106 to the cooling coil 112. The coils 106 and 112 may be fastened in a variety of processes including e-beam welding at high vacuum (UV) or UHV environments to minimize contamination during welding. Other methods to join the first ribbon coil 106 and second tubular coil 112 may also be used, preferably those that minimize contamination, and provide suitable structural strength and heat and electrical conductivity between the two coils.

In accordance with another aspect of the present invention, the cooling coil 112 is positioned on an outer face 136 of the RF ribbon coil 106 so that the ribbon coil 106 is positioned between the cooling coil 112 and the central plasma generation area 108. As explained below, such an arrangement has several advantages. In the illustrated embodiment, the hybrid coil 104 is insulatively carried by standoffs 138 (FIG. 1) and RF feedthroughs 140 which position the coil 104 close to a grounded shield wall 142. Because there is relatively little space between the coil 104 and the shield wall 142, there are relatively few ions between the coil 104 and the wall 142. Hence, most of the plasma ions available to sputter the hybrid coil 104 are located in the central plasma generation area 108 which is faced by the inner face 132 of the ribbon coil 106. It is believed that the inner face 132 of the ribbon coil 106 will tend to shield the outer face 136 of the ribbon coil and hence the cooling coil 112 as well, which is carried on the coil outer face 136. Consequently, it is believed that the majority of the material sputtered from the hybrid coil 104 will be sputtered from the inner face 132 together with the top and bottom faces 144a and 144b of the coil 106 and relatively little, if any, will be sputtered from the cooling coil 112. As a result, the cooling coil 112 may be fabricated from less expensive materials than the sputtering coil 106 which is preferably made of the same high quality material as the target 114.

Figure 3:
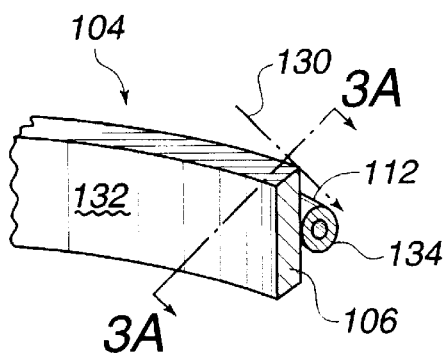
FIG. 3 is a partial perspective view of the hybrid coil of FIG. 1.
Figure 3A:
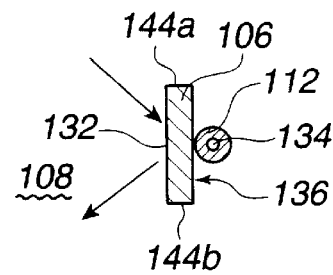
FIG. 3a is a cross-sectional view of the coil of FIG. 3.

For example, the first coil 106 of the illustrated embodiment in FIG. 3 may be comprised of a heavy duty bead blasted solid high-purity (preferably 99.995% pure) titanium ribbon formed into a single turn coil having a width of ⅛ to 1/16 inches (3 to 1.5 mm), a height from 1 to 2 inches (25 to 50 mm), and a diameter of 10–12 inches (250–300 mm). However, other highly conductive materials and shapes may be utilized depending on the material being sputtered and other factors. For instance, if the material to be sputtered is aluminum, both the target and the coil may be made of high purity aluminum. Still further, instead of the ribbon-shaped coil, a multiple turn coil may be implemented with flat, open-ended annular rings. The advantage of a multiple turn coil is that the required current levels can be substantially reduced for a given RF power level. However, multiple turn coils tend to be more complicated and hence more costly and difficult to fabricate, support and clean as compared to single turn coils. Multiple turn coils may also be shaped as spirals or helixes, for example.

The second tubular coil 112 coupled to the first coil 106 may be round and have an outer diameter of 3/8 or 1/4 inches (10 or 44 mm). The first coil 106 and second tubular coil 112 can be made of the same type of high purity material to minimize contamination. Because there is little or no net sputtering from the second tubular coil 112, the second tubular coil 112 could also be made of a lesser grade material but of the same type as the ribbon coil. Alternatively, the cooling coil 112 may be formed of other types of materials with high thermal conductivity (such as CU) and coated with a thick layer of high purity material of the same type as the first ribbon coil 106.

In the illustrated embodiment, RF current is supplied to the hybrid coil 104 by the RF feedthroughs 140 which are attached to the open ends of the ribbon coil 106. The tubular coil 112 is connected to a source of water or other coolant which maintains a continuous flow of coolant through the tubular coil 112. Also, a tubular conductive conduit may be used to supply both RF current and coolant to the tubular coil 112.

For example, conductive conduits may be used to pass the RF current and coolant water from the exterior of the chamber, through the apertures in walls of the vacuum chamber and through apertures in the shield wall 142 to the coil. Ceramic insulators insulate the conduits from the walls of the chamber and the shield which are typically at ground. If the RF current is supplied directly to the tubular coil 112 instead of the ribbon coil 106, it is preferred that the welding or other method used to attach the tubular coil 112 to the ribbon coil 106 provide a good electrical contact as well as thermal contact. On the other hand, if RF current is supplied directly by the feedthroughs to the ribbon coil 106 which is employed as the primary RF and sputtering coil, good electrical contact between the ribbon coil 106 and the cooling coil 112 is less of a concern.

Figure 4:
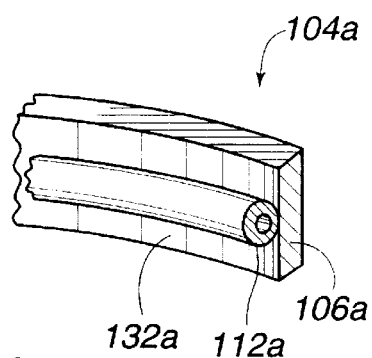
FIG. 4 is a partial perspective view of a hybrid coil in accordance with another embodiment of the present invention.

FIG. 4 illustrates an alternative embodiment in which a tubular cooling coil 112a is coupled to the inner side 132a of a ribbon coil 106a. Because positioning the tubular coil 112a on the inner side 132a of the first ribbon coil 106 as shown in FIG. 4 provides a greater surface area facing the ionization area, it is believed that the sputtering rate of the hybrid coil 104a may be enhanced. Since the cooling coil 112a could provide a substantial source of sputtered material, the tubular coil 112a is preferably made of the same high grade target material as the ribbon coil 106a. However, it is recognized that such an arrangement may also lead to an increase in the generation of undesirable particulate matter.

Figure 5:
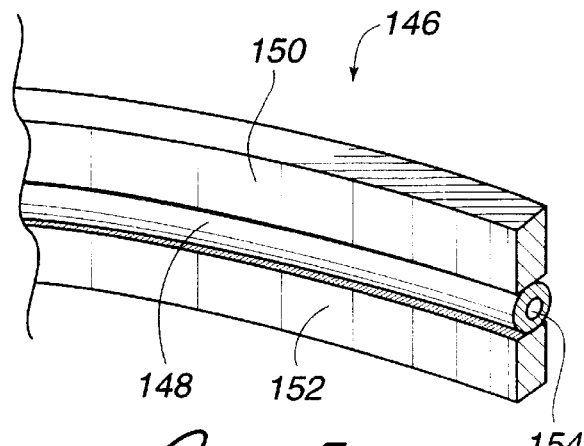
FIG. 5 is a partial perspective view of a hybrid coil in accordance with yet another embodiment of the present invention.

FIG. 5 shows a hybrid coil 146 which includes a tubular cooling coil 148 having an upper flange 150 and lower flange 152 extending from the tubular cooling coil 148. During the ionization process, material is sputtered from both flanges 150 and 152 as well as the cooling coil 148 onto the substrate. Because the flanges 150, 152 are thermally coupled to the cooling coil 148, the flanges 150, 152 are cooled by heat transfer from the flanges 150, 152 to the tubular coil 148. The flanges 150, 152 may be formed integrally with the cooling coil 148 by various processes including machine rolling or casting processes, for example. Alternatively, the flanges 150 and 152 can be fastened to the tubular coil 148 by welding the flanges to the upper and lower sides, respectively, of the tubular coil 148. The tubular coil 148 preferably has an internal coolant carrying channel 154 for cooling the flanges 150, 152.

Figure 6:
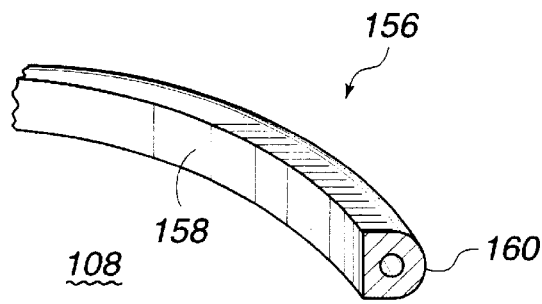
FIG. 6 is a partial perspective view of a hybrid coil in accordance with another embodiment of the present invention.
Figure 6A:
FIG. 6a is a cross-sectional view of the coil of FIG. 6.

It is also contemplated that a coil in accordance with the present invention may comprise a single contiguous coil having an inner, solid, sputtering region and an outer, hollow cooling region. For example, FIG. 6 shows an alternative hybrid coil 156 which is generally tubular-shaped with a non-circular exterior cross-section as shown in the radial cross-sectional view of FIG. 6A. More particularly, this embodiment has a relatively flat inner sputtering surface 158 which faces the ionization area 108 (FIG. 2). It is believed that this non-circular cross-section of the coil increases the total sputtering surface of the sputtering region of the coil to increase the sputtering rate of the tubular coil 156. A channel of the hollow, outer cooling region 160 permits the passage of a coolant such as water. It is recognized that other non-circular exteriors, such as ovals, may also be utilized to increase the sputtering rate of the water cooling coil.

The preferred coil embodiments discussed herein can be used to deposit many different types of metals, such as Al, Ti, Ta, Cu, etc., and metal nitrates, such as TiN, TaN, etc. If one or more additional coils are used with the tubular coil, then the tubular coil and additional coils may be comprised of the same material or, alternatively, different materials. Still further, additional tubular cooling coils as well as sputtering coils may be added to the embodiments discussed herein. The use of multiple coils is disclosed in the aforementioned copending application Ser. No. 08/680,335, entitled "Coils for Generating a Plasma and for Sputtering."

It will, of course, be understood that modifications of the present invention, in its various aspects, will be apparent to those skilled in the art, some being apparent only after study others being matters of routine mechanical and electronic design. Other embodiments are also possible, their specific designs depending upon the particular application. As such, the scope of the invention should not be limited by the particular embodiments herein described but should be defined only by the appended claims and equivalents thereof.

What is claimed is:

1. An apparatus for sputter deposition of a film layer onto a substrate comprising:

a vacuum chamber;

a substrate support disposed within said vacuum chamber, a target disposed within said chamber; and a coil disposed within said chamber and extending within a space defined between said target and substrate support, said coil having an outer surface and a coolant carrying channel defined within said coil, wherein at least a portion of said coil has an outer surface that is non-circular in shape in orthogonal cross-section along its length, and wherein at least part of said outer surface is a sputtering surface.

2. The apparatus of claim 1 wherein at least a portion of said coil sputtering surface is flat.

3. The apparatus of claim 1, wherein said coil comprises a first ribbon-shaped coil and a second tubular coil thermally coupled to said first coil, wherein said outer surface is defined by said first ribbon-shaped coil and said second tubular coil.

4. The apparatus of claim 3, wherein said first ribbon-shaped coil and second tubular coil are each ring-shaped.

5. The apparatus of claim 4, wherein said first ribbon-shaped coil defines an inner face facing a central portion of said chamber and an outer face facing away from said central portion of said chamber, and said second tubular coil is coupled to said outer face of said first ribbon-shaped coil.

6. The apparatus of claim 4, wherein said first ribbon-shaped coil defines an inner face facing a central portion of said chamber and an outer face facing away from said central portion of said chamber, and said second tubular coil is coupled to said inner face of said ribbon-shaped coil.

7. The apparatus of claim 1, wherein said target comprises a sputterable material, and said coil is comprised of the same sputterable material as said target.

8. The apparatus of claim 1, wherein said coil is adapted to radiate RF energy from said coil.

9. An apparatus for sputter deposition of a film layer onto a substrate comprising:
   a vacuum chamber;
   a substrate support disposed within said vacuum chamber;
   a target disposed within said chamber;
   a first coil disposed within said chamber and extending through a space defined between said target and substrate support; and
   a second coil disposed within said chamber and thermally coupled to said first coil,
   wherein said first coil is non-circular in perpendicular cross section along its length.

10. The apparatus of claim 9, wherein said second coil defines a coolant carrying channel within said second coil.

11. The apparatus of claim 9, wherein both said first coil and said second coil are each ring-shaped.

12. The apparatus of claim 11, wherein said first coil defines an outer surface facing away from a central region of said chamber and second coil is coupled to said outer surface of said first coil.

13. The apparatus of claim 11, wherein said first coil defines an inner surface facing a central region of said chamber and second coil is coupled to said inner surface of the said first coil.

14. The apparatus of claim 9, wherein said first coil is adapted to radiate RF energy from said coil.

15. The apparatus of claim 9, wherein said first coil has a width at least twice that of said second coil.

16. An apparatus for sputter deposition of a film layer onto a substrate comprising:
   a vacuum chamber;
   a substrate support disposed within said vacuum chamber;
   a target disposed within said chamber;
   a coil disposed within said chamber and extending within a space defined between said target and substrate support, said coil having a coolant carrying channel within said coil,
   a plurality of standoffs for supporting said coil in said chamber, and
   a first flange extending outward from a surface of said coil, wherein at least a portion of said first flange is positioned along a length of said coil between adjacent standoffs.

17. The apparatus of claim 16 further comprising a second flange extending outward from a surface of said coil.

18. The apparatus of claim 17 wherein said coil is positioned between said first and second flanges.

19. The apparatus of claim 18 wherein said first and second flanges are welded to said coil.

20. An apparatus for energizing a plasma within a semiconductor fabrication system to sputter material onto a workpiece, the apparatus comprising:
   a semiconductor fabrication chamber having a plasma generation area within said chamber;
   a sputtering target carried within said chamber and made of a first material, said target being positioned to sputter said target material onto said workpiece; and
   a first ring-shaped ribbon coil disposed within said chamber and extending through a space defined between said target and substrate support, wherein said first coil is positioned to couple energy into the plasma generation area and to sputter coil material onto said workpiece so that both coil material and target material are deposited on said workpiece to form a layer thereon; and
   a second ring-shaped coil thermally coupled to said first coil, said second coil having a coolant carrying channel defined therein.

21. A method of depositing material onto a workpiece in a sputter deposition chamber, comprising:
   sputtering target material onto said workpiece from a target positioned in said chamber;
   sputtering material onto said workpiece from a first coil having an outer surface that is non-circular in shape; and
   flowing a coolant through a second tubular-shaped coil thermally coupled to said first coil to cool said first coil.

22. The method of claim 21, wherein said first coil is ribbon-shaped.

23. A coil for a sputter deposition apparatus using RF energy, comprising:
   a coil adapted to radiate said RF energy, said coil having a coolant carrying channel defined within said coil, wherein at least a portion of said coil has an outer surface that is non-circular in shape in orthogonal cross-section along its length, and wherein at least a part of said outer surface is adapted to be a sputtering surface.

24. The coil of claim 23, wherein at least a portion of said sputtering surface is flat.

25. The coil of claim 23, wherein said coil comprises a first ribbon-shaped coil portion and a second tubular coil portion thermally coupled to said first coil portion.

26. The coil of claim 25, wherein said first ribbon-shaped coil portion and second tubular coil portion are each ring-shaped.

27. The coil of claim 26, wherein said first ribbon-shaped coil defines an outer surface facing away from a central region of said chamber and said second tubular coil is coupled to said outer surface of said first ribbon-shaped coil.

28. The coil of claim 26, wherein said first ribbon-shaped coil portion defines an inner surface and said second tubular coil is coupled to said inner surface of said ribbon-shaped coil.

29. The coil of claim 23, wherein said coil is comprised of a sputter deposition material selected from the group of titanium, tantalum, copper and aluminum.

30. A coil for use in an apparatus for sputter deposition of a film layer onto a substrate, said coil comprising:
   a first coil portion having at least one flat sputtering surface; and a second tubular-shaped coil portion thermally coupled to said first coil portion.

31. The coil of claim 30, wherein said second tubular-shaped coil portion defines a coolant carrying channel therein.

32. The coil of claim 30, wherein both said first coil portion and said second tubular-shaped coil portion are each ring-shaped.

33. The coil of claim 30, wherein said first coil portion is a ribbon-shaped coil which defines an inner side and an outer side, and said second tubular-shaped coil portion is coupled to said outer side of said first ribbon-shaped coil.

34. The coil of claim 30, wherein said first coil portion is a ribbon-shaped coil which defines an inner side and an outer side, and said second tubular-shaped coil portion is coupled to said inner side of said ribbon-shaped coil.

35. The coil of claim 30, wherein said first coil portion has width at least twice as wide as the width of said second tubular-shaped coil portion.

36. A coil for an apparatus for sputter deposition of a film layer onto a substrate, comprising:

a tubular-shaped coil portion;

a plurality of standoffs for supporting said tubular-shaped coil portion in a chamber, and a first flange extending outward from a surface of said tubular-shaped coil portion, wherein at least a portion of said first flange is positioned along a length of said tubular-shaped coil portion between adjacent standoffs.

37. The coil of claim 36 further comprising a second flange extending outward from a surface of said tubular-shaped coil portion.

38. The coil of claim 37 wherein said tubular-shaped coil portion is positioned between said first and second flanges.

39. The coil of claim 38 wherein said first and second flanges are welded to said tubular-shaped coil portion.

40. The coil of claim 36, wherein said tubular-shaped coil defines a coolant carrying channel within said coil.

41. An antennae for energizing a plasma within a semiconductor fabrication system to sputter material onto a workpiece, the antennae comprising:

a first ring-shaped ribbon coil adapted to sputter coil material onto said workpiece; and a second tubular ring-shaped coil thermally coupled to said first coil, said tubular-shaped coil having a coolant carrying channel defined therein.

42. A method of depositing material on a workpiece in a sputter deposition chamber, comprising:

sputtering target material onto said workpiece from a target positioned in said chamber;

sputtering coil material onto said workpiece from a coil disposed within the chamber and extending within a space defined between said target and substrate support, said coil having an outer surface and a coolant carrying channel defined within said coil, wherein at least a portion of said coil has an outer surface that is non-circular in orthogonal cross-section along its length; and flowing a coolant fluid through said coolant carrying channel.

43. The method of claim 42, further comprising passing RF current through said coil to energize a plasma in said chamber.

44. An apparatus for sputter deposition comprising:

a sputtering chamber;

a target disposed in said chamber;

a workpiece support disposed in said chamber;

a plasma generation region in said chamber; and a coil positioned in said chamber and adapted to supply energy to said plasma generation region, said coil including a coolant carrying channel therein, said coil including an outer surface having a non-circular shape in perpendicular cross section along at least part of its length, wherein at least a portion of said outer surface is adapted to be a sputtering surface.

45. An apparatus as in claim 44, wherein said coil includes a flat surface.

46. An apparatus as in claim 44, wherein said coil is a single turn coil.

47. An apparatus as in claim 1, wherein said coil along its entire length has an outer surface that is non-circular in shape in orthogonal cross-section.

48. An apparatus as in claim 44, wherein said coil includes an outer surface having a non-circular shape in perpendicular cross section along its entire length.

49. A coil for use in a sputter deposition apparatus, said coil being adapted to radiate energy, said coil including a coolant carrying channel therein, said coil including an outer surface having a non-circular shape in a plane orthogonal to orthogonal a longitudinal tangential axis of the coil, wherein at least a portion of said outer surface is adapted to be a sputtering surface.

* * * * *